US012298123B1

(12) United States Patent
Topalian et al.

(10) Patent No.: US 12,298,123 B1
(45) Date of Patent: May 13, 2025

(54) OPTICAL ALIGNMENT FOR ULTRA-HIGH COPLANARITY OF TWO PLANES

(71) Applicant: META PLATFORMS TECHNOLOGIES, LLC, Menlo Park, CA (US)

(72) Inventors: Peter Topalian, Seattle, WA (US); Kavous Jorabchi, Bellevue, WA (US)

(73) Assignee: Meta Platforms Technologies, LLC, Menlo Park, CA (US)

(*) Notice: Subject to any disclaimer, the term of this patent is extended or adjusted under 35 U.S.C. 154(b) by 294 days.

(21) Appl. No.: 17/700,386

(22) Filed: Mar. 21, 2022

(51) Int. Cl.
*G01B 11/27* (2006.01)
*G02B 27/42* (2006.01)
*G06T 7/00* (2017.01)

(52) U.S. Cl.
CPC ........ *G01B 11/272* (2013.01); *G02B 27/4205* (2013.01); *G06T 7/0004* (2013.01); *G06T 2207/20056* (2013.01); *G06T 2207/30148* (2013.01)

(58) Field of Classification Search
CPC . G01B 11/272; G02B 27/4205; G06T 7/0004; G06T 2207/20056; G06T 2207/30148
See application file for complete search history.

(56) References Cited

U.S. PATENT DOCUMENTS 4,698,834 A * 10/1987 Northrup ............... G03F 9/7023
378/34

OTHER PUBLICATIONS

"A New interferometric alignment technique", Applied Physics Letters, American Institute of Physics, 2 Huntington Quadrangle, Melville, Ny 11747, vol. 31, No. 7, Oct. 1, 1977 (Oct. 1, 1977), pp. 426-428, XP00901 2798, ISSN: 0003-6951, DOH: 10.1063/1. 89719 by Flanders et al. (Year: 1977).*
Flanders D.C., et al., "A New Interferometric Alignment Technique," Applied Physics Letters, vol. 31, No. 7, Oct. 1, 1977, 3 pages.
International Search Report and Written Opinion for International Application No. PCT/US2023/015659, mailed Jun. 13, 2023, 10 pages.

* cited by examiner

*Primary Examiner* — Jamil Ahmed
(74) *Attorney, Agent, or Firm* — Greenberg Traurig, LLP

(57) ABSTRACT

A device for determining coplanarity of two surfaces includes an illumination system for providing first light to a first surface and providing second light to a second surface. The first surface redirects at least a portion of the first light and the second surface redirects at light a portion of the second light. The device also includes an optical detector positioned to receive an overlap of the redirected portion of the first light and the redirected portion of the second light. An image of the overlap of the redirected portion of the first light and the redirected portion of the second light indicates coplanarity of the first surface and the second surface.

17 Claims, 7 Drawing Sheets

700

710 Provide first light to a first surface. The first surface redirects at least a portion of the first light.

712 The first surface includes one or more diffraction structures for redirecting the at least a portion of the first light

720 Provide second light to a second surface that is distinct and separate from the first surface. The second surface redirects at light a portion of the second light.

722 The second surface includes one or more diffraction structures for redirecting the at least a portion of the second light

730 The first light and the second light define a first angle. The redirected portion of the first light and the redirected portion of the second light define a second angle that is greater than the first angle.

740 Receive, with an optical detector, an overlap of the redirected portion of the first light and the redirected portion of the second light. An image of the overlap of the redirected portion of the first light and the redirected portion of the second light indicates coplanarity of the first surface and the second surface.

750 Analyze an image corresponding to the overlap of the redirected portion of the first light and the redirected portion of the second light

752 Perform Fourier transform on the image

760 Monitor movement of at least one of: the first surface or the second surface

Figure 7

OPTICAL ALIGNMENT FOR ULTRA-HIGH COPLANARITY OF TWO PLANES

TECHNICAL FIELD

This application relates generally to photolithography, and more specifically to alignment of substrates for photolithography.

BACKGROUND

Photolithography, also called optical lithography, is widely used in semiconductor industry for forming patterns. Due to the interest in reducing sizes of electrical components, there have been many advancements that allow fabrication of smaller features, for example, by using short wavelength (e.g., extreme ultraviolet) light.

SUMMARY

The coplanarity of a mask and a substrate also has a significant impact on the quality of the photolithography. For example, a movement of a mask relative to a substrate or a movement of the substrate relative to the mask may degrade the quality of patterns formed on the substrate. Thus, optical systems used in photolithography require extremely tight control of the optical paths and the coplanarity, which often requires millidegree/nanometer precision.

Accordingly, there is a need for a method and a device for precisely determining the alignment between the mask and the substrate. However, conventional methods for determining the alignment between the mask and the substrate are often limited by the resolution of an imaging detector (e.g., a charge-coupled device).

Devices and methods described herein allow precise determination of alignment or coplanarity between two surfaces. By utilizing interferometry, the alignment of the two surfaces may be determined with a precision that exceeds the resolution of an imaging detector.

In accordance with some embodiments, a device for determining coplanarity of two surfaces includes an illumination system for providing first light to a first surface and providing second light to a second surface that is distinct and separate from the first surface. The first surface redirects at least a portion of the first light and the second surface redirects at light a portion of the second light. The device also includes an optical detector positioned to receive an overlap of the redirected portion of the first light and the redirected portion of the second light. An image of the overlap of the redirected portion of the first light and the redirected portion of the second light indicates coplanarity of the first surface and the second surface.

In accordance with some embodiments, a method for determining coplanarity of two surfaces includes providing first light to a first surface. The first surface redirects at least a portion of the first light. The method also includes providing second light to a second surface that is distinct and separate from the first surface. The second surface redirects at light a portion of the second light. The method further includes receiving, with an optical detector, an overlap of the redirected portion of the first light and the redirected portion of the second light. An image of the overlap of the redirected portion of the first light and the redirected portion of the second light indicates coplanarity of the first surface and the second surface.

Thus, the disclosed embodiments provide devices and methods with increased precision in determining the coplanarity between two surfaces. Such devices and methods can form high quality patterns in photolithography, which in turn allows fabrication of high performance components.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIG. 7 is a flow diagram illustrating a method for determining coplanarity of two surfaces in accordance with some embodiments.

Figure 1:
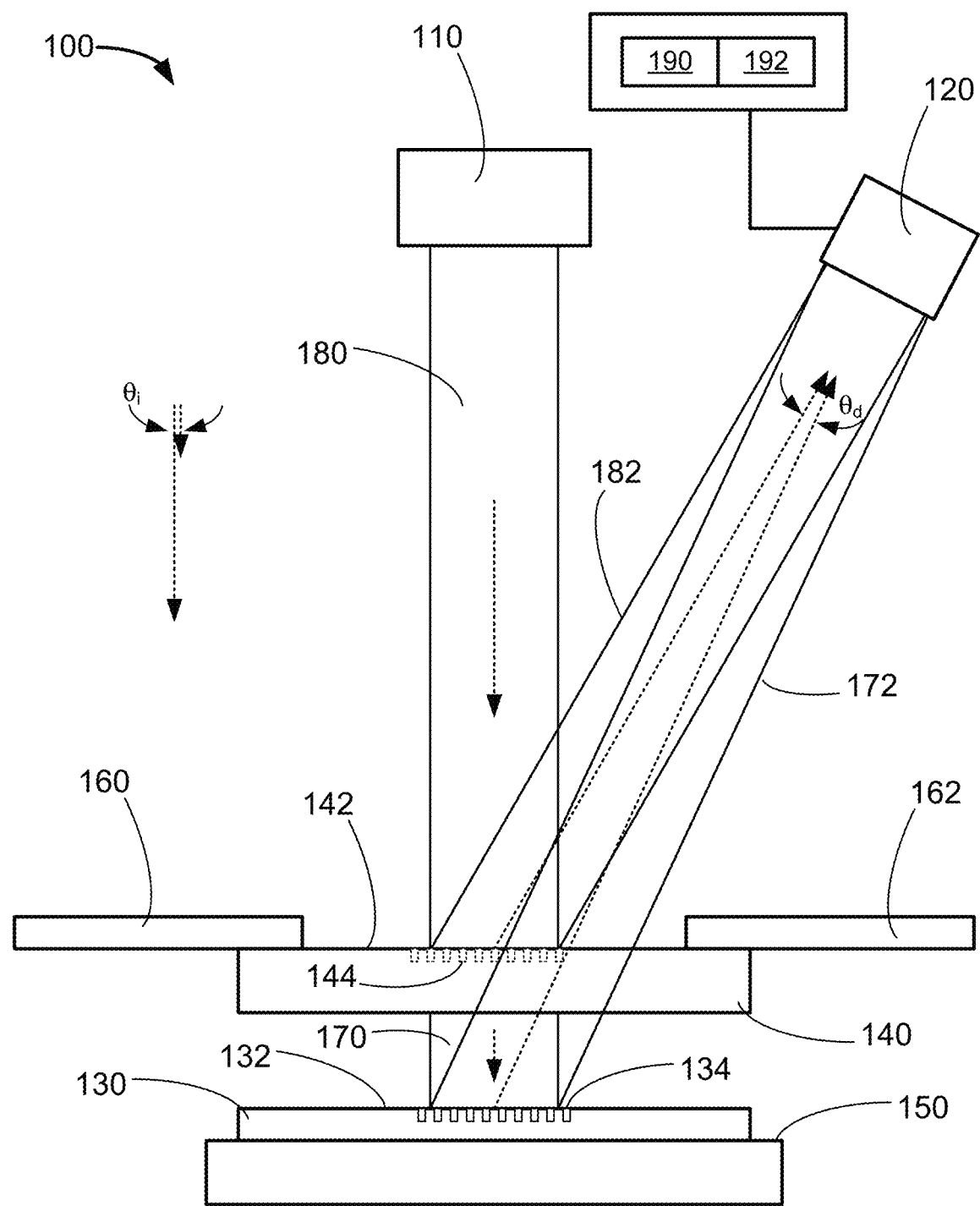
FIGS. 1-4 are schematic illustrations of devices for determining coplanarity of two surfaces in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

Features from any of the embodiments described herein may be used in combination with one another in accordance with the general principles described herein. These and other embodiments, features, and advantages will be more fully understood upon reading the following detailed description in conjunction with the accompanying drawings and claims.

These figures are not drawn to scale unless indicated otherwise.

DETAILED DESCRIPTION

As explained above, the coplanarity of a mask and a substrate has a significant impact on the quality of the photolithography. For example, a movement of a mask relative to a substrate or a movement of the substrate relative to the mask may degrade the quality of patterns formed on the substrate (e.g., reducing the contrast of patterns or reducing the uniformity of the patterns).

The devices and methods described herein allow determination of coplanarity of the mask and the substrate. The determined coplanarity (e.g., a tilt angle between the mask and the substrate) may be used to determine whether the position or orientation of the mask or the substrate needs to be adjusted. The determined coplanarity may also be used to determine that the relative position and orientation between the mask and the substrate are acceptable (e.g., the tilt angle between the mask and the substrate is less than a threshold) so that subsequent operations (e.g., photolithography) may be performed.

In addition, the described devices and methods may be used for determining coplanarity of two surfaces (and adjusting the positions or orientations of the two surfaces) other than a mask and a substrate. For example, the described devices and methods may also be used for aligning optical components.

FIGS. 1-4 are schematic illustrations of devices for determining coplanarity of two surfaces in accordance with some embodiments.

FIG. 1 illustrates a device 100 for determining coplanarity of two surfaces (e.g., a surface 132 of a substrate 130 and a surface 142 of a mask 140, which is distinct and separate from the substrate 130) in accordance with some embodiments.

In some embodiments, the mask 140 is held by one or more fixtures 160 and 162 (e.g., a mask holder). In some embodiments, the substrate 130 is placed on a substrate holder 150. In some embodiments, the substrate holder 150 provides six degrees-of-freedom in positioning the substrate 130. For example, in some configurations, the substrate holder 150 is configured to move (e.g., translate) the substrate 130 in x-y-z coordinates, rotate the substrate 130 (e.g., about an axis of rotational symmetry), and tilt (e.g., pitch and roll) the substrate 130.

The device 100 includes an illumination system 110 for providing first light 170 to a first surface (e.g., the surface 132 of the substrate 130) and providing second light 180 to a second surface (e.g., the surface 142 of the mask 140) that is distinct and separate from the first surface.

In some embodiments, the illumination system 110 includes one or more light sources for providing the first light 170 and the second light 180. By way of example, the light source may include a surface-emitting device, e.g., a top- or bottom-emitting device such as a vertical cavity surface emitting laser (VCSEL), a vertical external cavity surface emitting laser (VECSEL), or a light-emitting diode (LED) such as an organic light emitting diode (OLED) or a resonant cavity light emitting diode (RCLED). In some embodiments, the light source may include an edge-emitting device, e.g., a laser diode or a superluminescent diode (SLED). In certain embodiments, the light source may include a single emitter or a plurality of emitters. In some embodiments, the plurality of emitters is arranged in an addressable array.

In some embodiments, the first light is coherent (e.g., temporally and/or spatially coherent) and the second light is coherent (e.g., temporally and/or spatially coherent).

By way of example, a light source including a laser diode or a light emitting diode may include an indirect bandgap semiconductor or a direct bandgap semiconductor, such as Si, GaAs, InGaAs, AlGaAs, GaN, InGaN, AlGaN, GaP, GaAsP, AlGaInP, and the like. In some embodiments, the light source may include one or more optical elements configured to enhance light extraction and focusing efficiency, such as one or more micro lenses, total internal reflection (TIR) concentrators and/or total internal reflection-refraction (TIR-R) concentrators.

In some embodiments, as shown in FIG. 1, the first light 170 provided to the first surface 132 and the second light 180 provided to the second surface 142 are parallel (e.g., the angle $\theta_i$ between the first light 170 and the second light 180 is zero).

In some embodiments, as shown in FIG. 1, the first light 170 is a portion of the second light 180, transmitted through the second surface (e.g., in FIG. 1, a portion 182 of the second light 180 is redirected by the surface 142 and another portion of the second light 180 is transmitted through the surface 142 and propagates as the first light 170).

In some embodiments, as shown in FIG. 1, the illumination system 110 is configured (e.g., positioned) to provide the first light 170 in a direction substantially perpendicular to the first surface 132 (e.g., within 5 degrees, 4 degrees, 3 degrees, 2 degrees, or 1 degree from the surface normal of the first surface 132). In some embodiments, the illumination system 110 is positioned to provide the first light 170 in a direction perpendicular to the first surface 132 (e.g., having 0 degrees with the surface normal of the first surface 132). In some embodiments, the illumination system 110 is positioned to provide the first light 170 in a direction non-perpendicular to the first surface 132.

The first surface, illuminated by the first light 170, redirects (e.g., reflects, refracts, or diffracts) at least a portion of the first light 170 (e.g., into a redirected portion 172 of the first light) and the second surface, illuminated by the second light 180, redirects (e.g., reflects, refracts, or diffracts) at light a portion of the second light 180 (e.g., into a redirected portion 182 of the second light).

In some embodiments, the portion 172 of the first light 170 redirected by the first surface 132 and the portion 182 of the second light 180 redirected by the second surface 142 are substantially parallel (e.g., the angle $\theta_d$ between the directions of the redirected portion 172 of the first light 170 redirected by the first surface 132 and the redirected portion 182 of the second light 180 redirected by the second surface 142 is less than 5 degrees, 4 degrees, 3 degrees, 2 degrees, 1 degree, 0.9 degrees, 0.8 degrees, 0.7 degrees, 0.6 degrees, 0.5 degrees, 0.4 degrees, 0.3 degrees, 0.2 degrees, 0.1 degrees, 0.09 degrees, 0.08 degrees, 0.07 degrees, 0.06 degrees, 0.05 degrees, 0.04 degrees, 0.03 degrees, 0.02 degrees, 0.01 degrees, 0.009 degrees, 0.008 degrees, 0.007 degrees, 0.006 degrees, 0.005 degrees, 0.004 degrees, 0.003 degrees, 0.002 degrees, or 0.001 degrees). In some embodiments, the portion 172 of the first light 170 redirected by the first surface 132 and the portion 182 of the second light 180 redirected by the second surface 142 are parallel (e.g., the angle between the directions of the redirected portion 172 of the first light 170 redirected by the first surface 132 and the redirected portion 182 of the second light 180 redirected by the second surface 142 is 0 degrees).

In some embodiments, as shown in FIG. 1, the first surface 132 includes one or more diffraction structures 134 (e.g., periodic structures arranged on a two-dimensional plane or in a three-dimensional space). In some embodiments, the one or more diffraction structures 134 include a diffraction grating (e.g., having a periodic groove structure). In some configurations, the one or more diffraction structures 134 redirect the portion 172 of the first light 170 by diffraction. In some embodiments, the spacing (e.g., a spacing between two adjacent grooves) of the one or more diffraction structures 134 is selected to direct the diffracted light into a particular orientation. For example, the spacing may be selected using the following equation:

$$m\lambda = d(\sin \alpha + \sin \beta)$$

where m is an order of diffraction, λ is a wavelength of light (e.g., the first light), d is the spacing between the two adjacent grooves, α is an angle of the incident light relative to the surface normal of the grating plane, and β is an angle of the diffracted light relative to the surface normal of the grating plane. For example, when the first light 170 is provided perpendicularly to the first surface 132 (e.g., α=0), the angle β of the diffracted light of the first order (e.g., m=1) corresponds to:

$$\beta = \sin^{-1}(\lambda/d).$$

In some embodiments, as shown in FIG. 1, the second surface 142 includes one or more diffraction structures 144 (e.g., periodic structures arranged on a two-dimensional plane or in a three-dimensional space). In some embodiments, the one or more diffraction structures 144 include a diffraction grating (e.g., having a periodic groove structure). In some configurations, the one or more diffraction structures 144 redirect the portion 182 of the second light 180 by diffraction. In some embodiments, the spacing (e.g., a spacing between two adjacent grooves) of the one or more diffraction structures 144 is selected to direct the diffracted light into a particular orientation. For example, even when the second light 180 is provided in a direction substantially perpendicular to the second surface 142, the direction of the diffracted light may be non-perpendicular to the second surface 142 (e.g., the diffracted light may be directed to a desired direction by adjusting the spacing of the one or more diffraction structures 144).

The device 100 also includes an optical detector 120 positioned to receive an overlap of the redirected portion 172 of the first light and the redirected portion 182 of the second light. In some embodiments, the optical detector 120 is an imaging detector (e.g., a charge-coupled device, a complementary metal-oxide-semiconductor (CMOS) sensor, a scan image sensor, etc.).

An image of the overlap of the redirected portion 172 of the first light and the redirected portion 182 of the second light indicates coplanarity of the first surface and the second surface. For example, as described with respect to FIG. 6A, the image of the overlap includes an interference pattern (e.g., interference fringes), which indicate the coplanarity between the two surfaces, namely the first surface 132 and the second surface 142.

In some embodiments, the device 100 includes one or more processors 190 and memory 192. The memory 192 stores instructions for execution by the one or more processors 190. The stored instructions include instructions for analyzing an image corresponding to the overlap of the redirected portion of the first light and the redirected portion of the second light. For example, the stored instructions may include instructions for counting a number of fringes in the image and/or determining a spacing between two adjacent fringes in the image.

In some embodiments, the instructions for analyzing the image include instructions for performing Fourier transform of the image (e.g., identifying frequency components and their amplitudes and/or phases). In some embodiments, the instructions for analyzing the image include instructions for performing inverse Fourier transform of the image.

Figure 2:
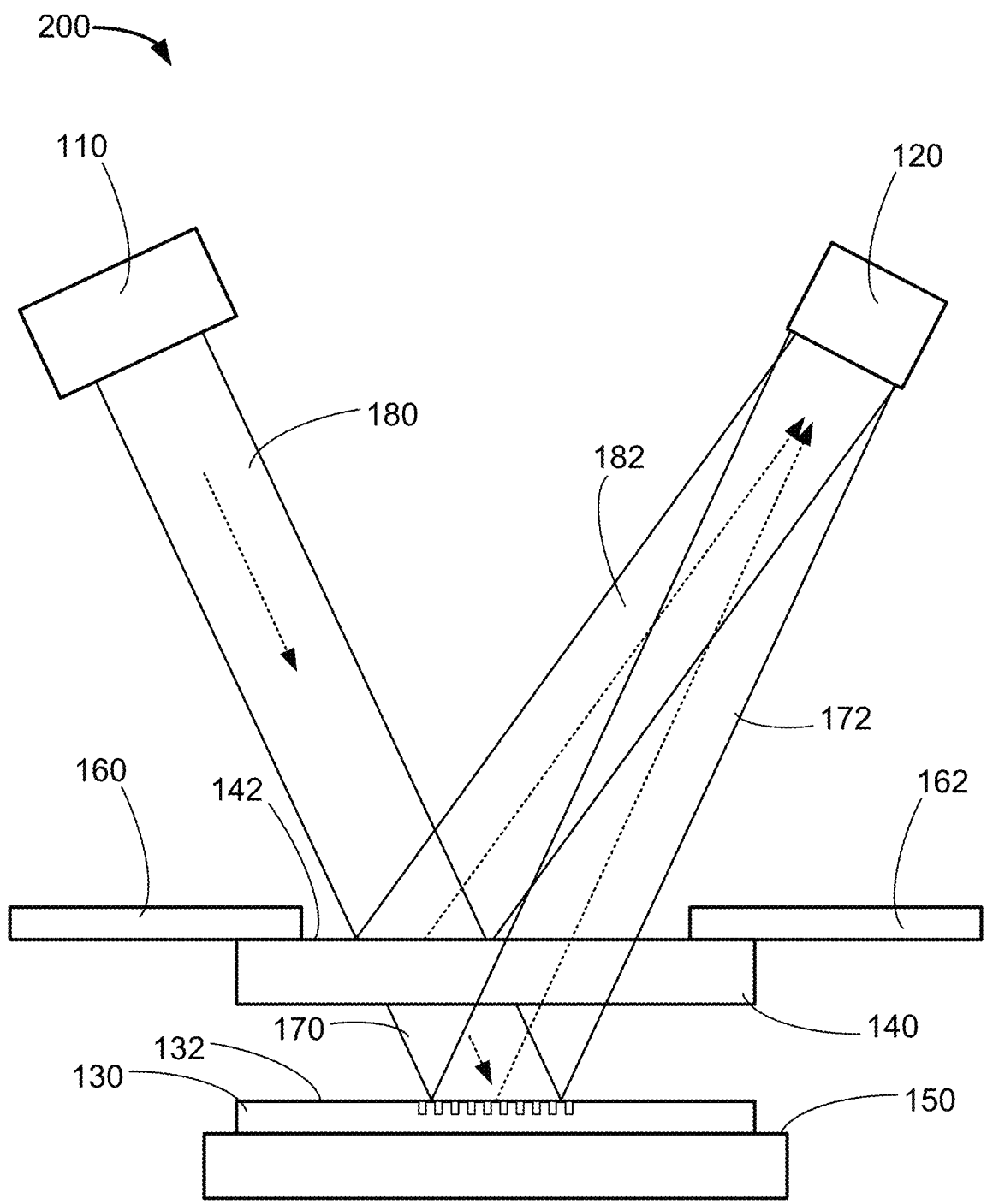

FIG. 2 illustrates a device 200 for determining coplanarity of two surfaces in accordance with some embodiments. The device 200 is similar to the device 100 except that the illumination system 110 of the device 200 provides the second light 180 in a direction that is non-perpendicular to the second surface 142. In some configurations, as shown in FIG. 2, the illumination system 110 of the device 200 also provides the first light 170 in a direction that is non-perpendicular to the first surface 132. In some configurations, the illumination system 110 of the device 200 also provides the first light 170 in a direction that is perpendicular to the first surface 132.

In some configurations, the illumination system 110 provides the first light 170 in a direction that is perpendicular to the first surface 132 and provides the second light 180 in a direction that is non-perpendicular to the second surface 142.

In some embodiments, the second surface 142 does not include one or more diffraction structures. Thus, in some configurations, the second surface 142 redirects at least a portion of the second light 180 by reflection or refraction (e.g., instead of diffraction). In some embodiments, the second surface 142 includes one or more diffraction structures, as described with respect to FIG. 1.

Figure 3:
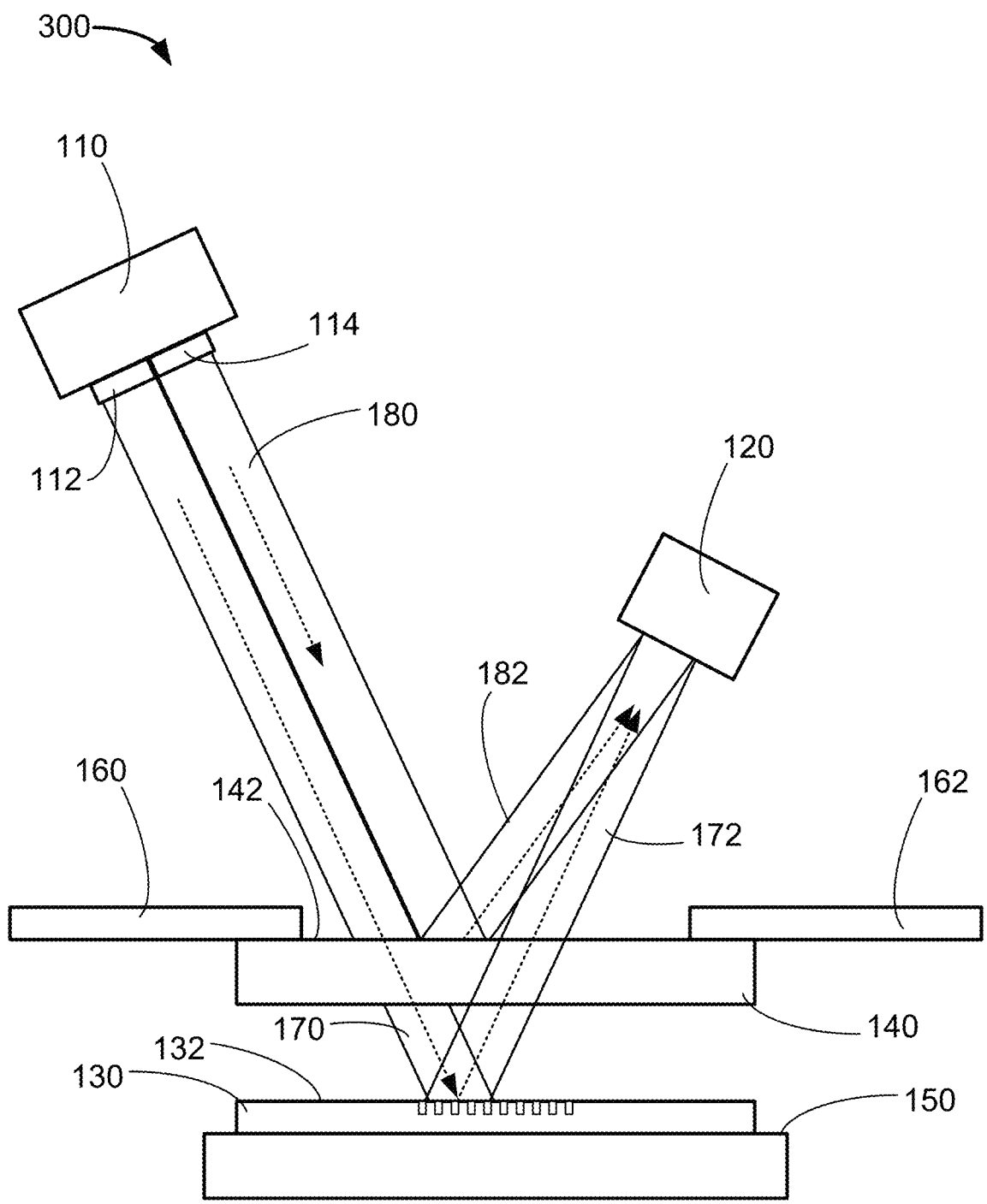

FIG. 3 illustrates a device 300 for determining coplanarity of two surfaces in accordance with some embodiments. The device 300 is similar to the device 200 except that the illumination system 110 of the device 300 includes a first light source 112 for providing the first light 170 and a second light source 114 for providing the second light 180. In some configurations, the first light source 112 and the second light source 114 are solid-state lasers pumped by a common pump laser (e.g., a diode laser). In some configurations, the first light source 112 and the second light source 114 are beam delivery optics providing two beams split (e.g., using a beam splitter) from a single coherent light source (e.g., a laser). In some cases, the first light 170 and the second light 180 are substantially coherent (e.g., spatially and/or temporally) to each other.

Figure 4:
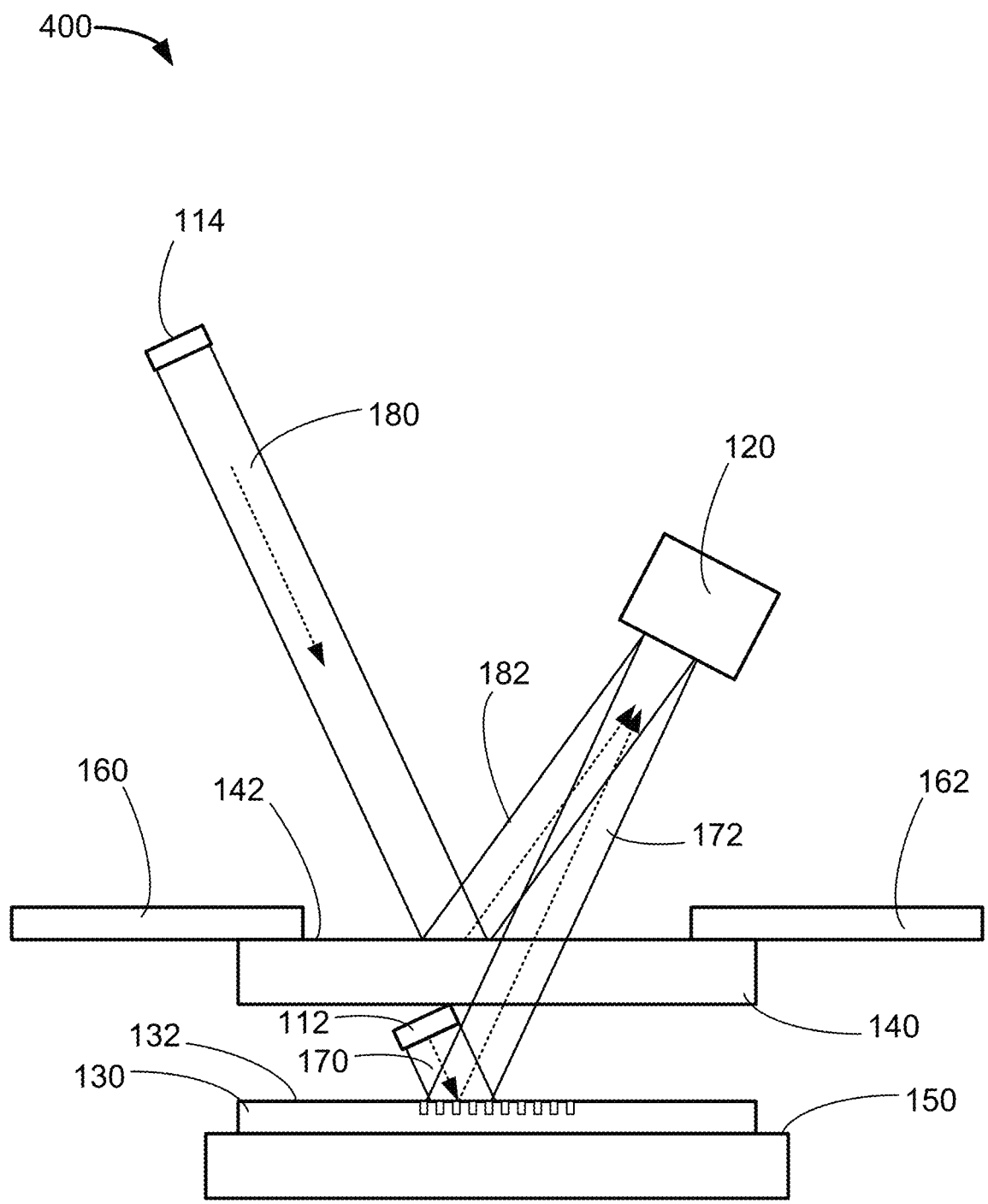

FIG. 4 illustrates a device 400 for determining coplanarity of two surfaces in accordance with some embodiments. The device 400 is similar to the device 300 except that the second light source 114 for providing the second light 180 is separate from the first light source 112 for providing the first light 170 (e.g., in FIG. 4, the second light source 112 is located on an opposite side of the mask 140 from the first light source 114). In some embodiments, the first light 170 provided by the first light source 112 and the second light 180 provided by the second light source 114 are parallel to each other. In some embodiments, the first light 170 provided by the first light source 112 and the second light 180 provided by the second light source 114 are non-parallel to each other.

Figure 5:
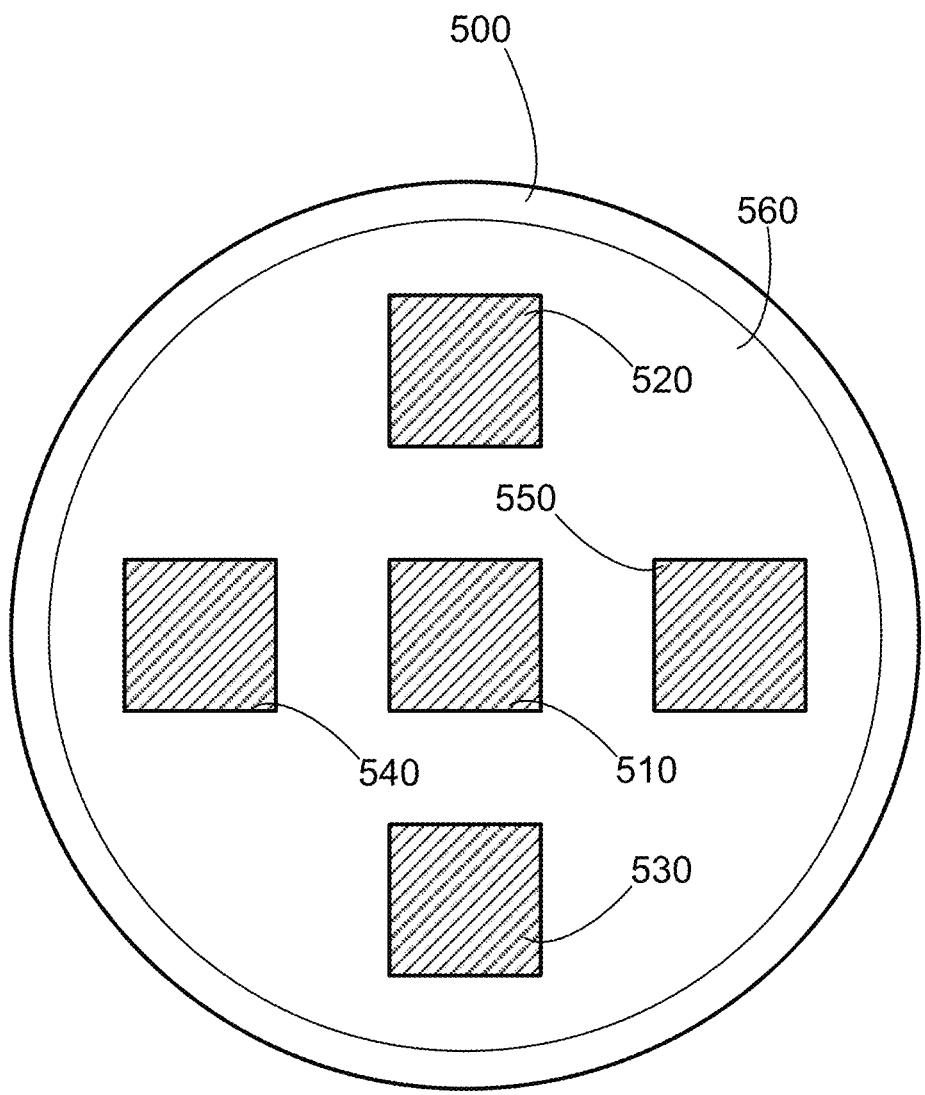
FIG. 5 is an illustration of a substrate with one or more diffraction structures in accordance with some embodiments.

FIG. 5 is an illustration of a substrate 500 with one or more diffraction structures in accordance with some embodiments. In some embodiments, the substrate 500 includes one or more diffraction structures in a center region 510 of the substrate 500. In some embodiments, the substrate 500 includes one or more diffraction structures in one or more peripheral regions 520, 530, 540, and/or 550. In some embodiments, the substrate 500 includes one or more diffraction structures in the center region 510 and one or more peripheral regions 520, 530, 540, and/or 550. In some embodiments, the substrate 500 includes one or more diffraction structures throughout a substantial portion 560 of a surface (e.g., a top surface) of the substrate 500. In some embodiments, the one or more diffraction structures are patterned onto the substrate 500 (e.g., a glass substrate or panel).

Figure 6A:
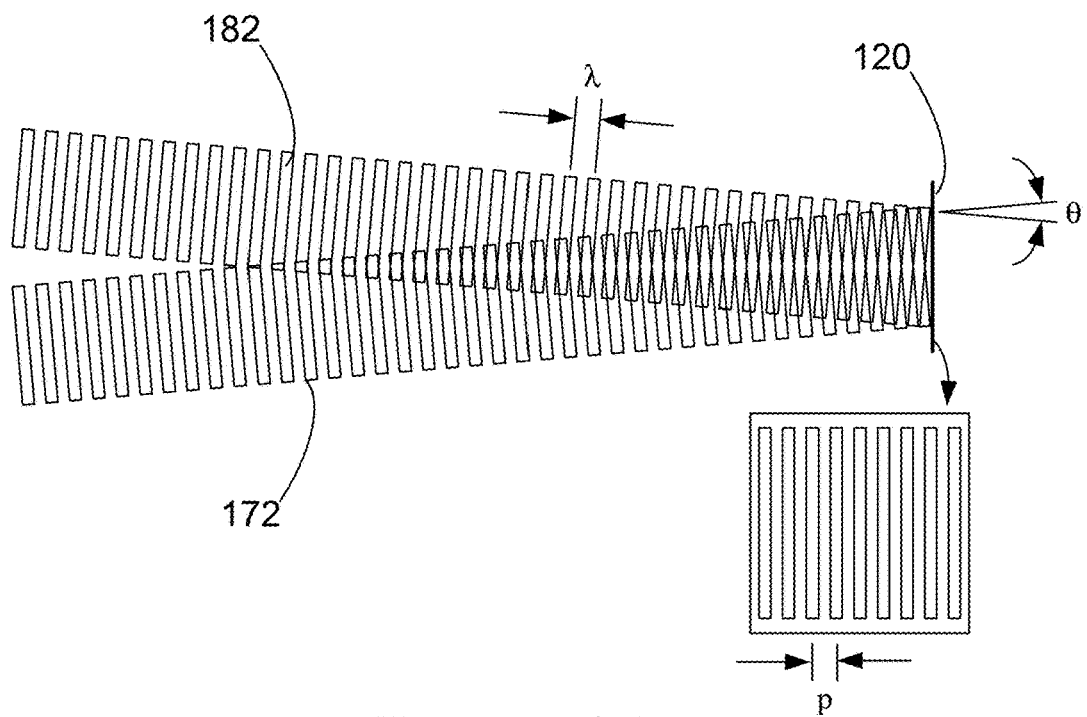
FIG. 6A illustrates interference of two beams in accordance with some embodiments.

FIG. 6A illustrates interference of two beams (e.g., the portion 172 of the first light 170 and the portion 182 of the second light) in accordance with some embodiments.

When the two beams propagate in directions having an angle θ, the interference pattern of the two beams on a plane (e.g., on an image sensor) includes fringes having a pitch p. In some cases, the pitch p is described as follows:

$$p = \lambda/2 \sin \theta$$

Figure 6B:
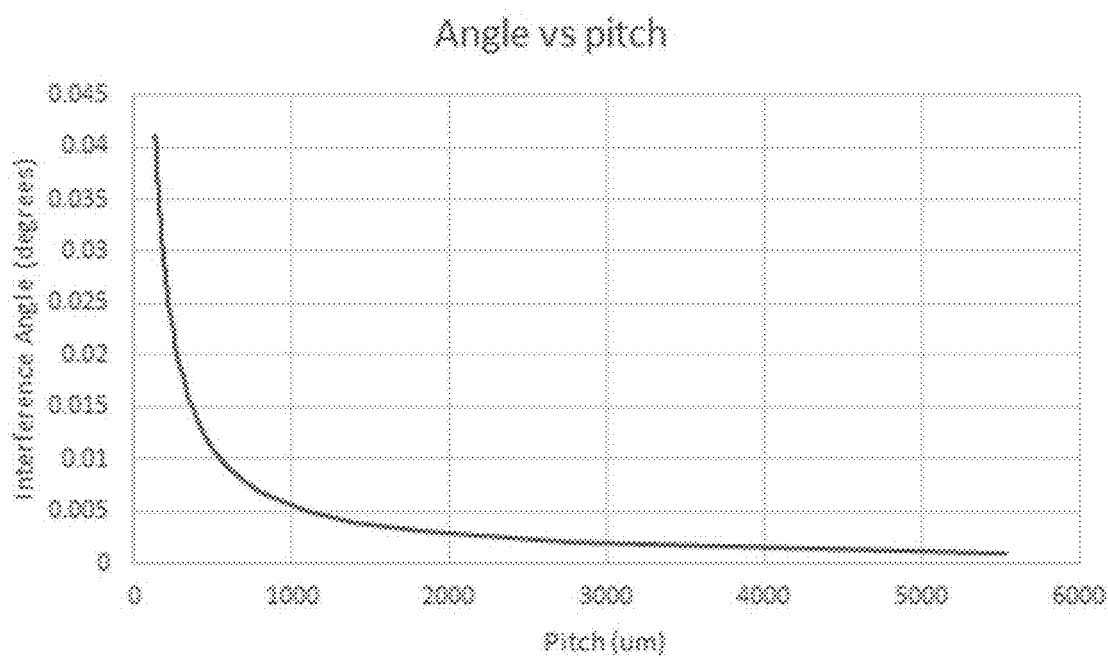
FIG. 6B is an example plot showing a relationship between an angle between two beams and a pitch in the interference pattern in accordance with some embodiments.

Thus, when the angle θ between the two beams is small, a large pitch p can be obtained, which facilitates the detection of the fringe patterns using an image sensor. FIG. 6B is an example plot showing a relationship between an angle between two beams and a pitch in the interference pattern in accordance with some embodiments. As described above, the plot in FIG. 6B shows that a large pitch can be obtained with a small angle θ. For example, for a wavelength of 193 nm (one of the wavelengths commonly used for lithography), two beams having an angle of 0.01 degrees provide a fringe pitch of over 500 μm, which can be readily detected by an imaging detector (e.g., a CCD sensor).

The image of the interference pattern may be used to determine a movement of the mask or the substrate. For example, movements that induce an angular shift (e.g., tilting) of the substrate or the mask may result in shifting of the fringe patterns (e.g., 10 nm vertical movement at one edge of a 200 mm wafer results in a shift of fringes by greater than 30 μm when θ is 0.001 degrees). Thus, the described devices provide great sensitivity in detecting movements of the surfaces.

FIG. 7 is a flow diagram illustrating a method 700 for determining coplanarity of two surfaces in accordance with some embodiments.

The method 700 includes (710) providing first light to a first surface (e.g., first light 170 to the first surface 132 shown in FIG. 1). The first surface redirects at least a portion of the first light (e.g., as the redirected portion 172).

In some embodiments, the first surface (712) includes one or more diffraction structures for redirecting the at least a portion of the first light (e.g., one or more diffraction structures 134 shown in FIG. 1).

The method 700 also includes (720) providing second light to a second surface that is distinct and separate from the first surface (e.g., second light 180 to the second surface 142 shown in FIG. 1). The second surface redirects at light a portion of the second light (e.g., as the redirected portion 182).

In some embodiments, the second surface (722) includes one or more diffraction structures for redirecting the at least a portion of the second light (e.g., one or more diffraction structures 144 shown in FIG. 1).

In some embodiments, the first light and the second light (730) define a first angle (e.g., the angle $\theta_i$ shown in FIG. 1). The redirected portion of the first light and the redirected portion of the second light define a second angle (e.g., the angle $\theta_d$ shown in FIG. 1) that is greater than the first angle.

The method 700 further includes (740) receiving, with an optical detector, an overlap of the redirected portion of the first light and the redirected portion of the second light (e.g., the optical detector 120 shown in FIG. 1 receives the overlap of the redirected portion 172 and the redirected portion 182). An image of the overlap of the redirected portion of the first light and the redirected portion of the second light indicates coplanarity of the first surface and the second surface (e.g., the fringe patterns indicate the relative movement of the first surface or the second surface).

In some embodiments, the method 700 includes (750) analyzing the image corresponding to the overlap of the redirected portion of the first light and the redirected portion of the second light. For example, an absence of any fringe may indicate that the two beams are parallel to each other. In some embodiments, analyzing the image includes (752) performing Fourier transform on the image. In some embodiments, performing the Fourier transform includes performing discrete Fourier transform or fast Fourier transform. In some embodiments, analyzing the image includes performing inverse Fourier transform on the image.

In some embodiments, the method 700 includes (760) monitoring movement of at least one of: the first surface or the second surface. For example, by monitoring changes to the image corresponding to the overlap of the redirected portion of the first light and the redirected portion of the second light, relative movement between the first surface and the second surface may be determined (e.g., changes in the fringe patterns indicate the relative movement between the first surface and the second surface).

In some embodiments, the method 700 includes repeating (i) providing the first light to the first surface, (ii) providing the second light to the second surface, and (iii) receiving the overlap for a plurality of regions of the first surface and the second surface (e.g., respective regions of the first surface and corresponding regions of the second surface). For example, the substrate and the mask may be moved in a scanning pattern while the overlap is received and recorded by the optical detector. Obtained images are analyzed to determine coplanarity in different regions of the substrate or the mask.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

As used herein, although the terms first, second, etc. are, in some instances, used herein to describe various elements, these elements should not be limited by these terms. These terms are used only to distinguish one element from another. For example, a first surface could be termed a second surface, and, similarly, a second surface could be termed a first surface, without departing from the scope of the various described embodiments. The first surface and the second surface are both surfaces, but they are not the same surface.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "has," "having," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "exemplary" is used herein in the sense of "serving as an example, instance, or illustration" and not in the sense of "representing the best of its kind."

Unless otherwise noted, the terms "connected to" and "coupled to" (and their derivatives), as used in the specification and claims, are to be construed as permitting both direct and indirect (i.e., via other elements or components) connection.

What is claimed is:

1. A device for determining coplanarity of two surfaces, the device comprising:
at least one light source positioned to provide first light that is non-perpendicular to a first surface and provide second light that is non-perpendicular to a second surface, wherein the second surface is distinct and separate from the first surface, the first surface redirects at least a portion of the first light via diffraction, the second surface redirects at least a portion of the second light via reflection or refraction, the first light provided to the first surface and the second light provided to the second surface are parallel to each other, and the portion of the first light redirected by the first surface and the portion of the second light redirected by the second surface are directed in respective directions that form a non-zero angle between each other; and
an optical detector positioned to receive an overlap of the redirected portion of the first light and the redirected portion of the second light, wherein an image of the overlap of the redirected portion of the first light and the redirected portion of the second light indicates coplanarity of the first surface and the second surface.

2. The device of claim 1, wherein the first light is coherent and the second light is coherent.

3. The device of claim 1, wherein the first light is a portion of the second light transmitted through the second surface.

4. The device of claim 1, wherein the at least one light source includes a first laser for providing the first light, a second laser, distinct and separate from the first laser for providing the second light.

5. The device of claim 1, wherein the first surface is on a first substrate and the second surface is on a second substrate that is distinct and separate from the first substrate.

6. The device of claim 1, wherein the first surface includes one or more diffraction structures.

7. The device of claim 6, wherein the one or more diffraction structures include a diffraction grating.

8. The device of claim 6, wherein the one or more diffraction structures are located along a periphery of a first substrate.

9. The device of claim 1, further comprising:
one or more processors; and
memory storing instructions for execution by the one or more processors, the stored instructions including instructions for analyzing an image corresponding to the overlap of the redirected portion of the first light and the redirected portion of the second light.

10. The device of claim 9, wherein the instructions for analyzing the image include instructions for performing Fourier transform on the image.

11. A method for determining coplanarity of two surfaces, the method comprising:
providing first light that is non-perpendicular to a first surface, wherein the first surface redirects at least a portion of the first light via diffraction;
providing second light that is non-perpendicular to a second surface, wherein the second surface is distinct and separate from the first surface, and the second surface redirects at least a portion of the second light via reflection or refraction, wherein the first light and the second light define a first angle with respect to each other; and
receiving, with an optical detector, an overlap of the redirected portion of the first light and the redirected portion of the second light, wherein an image of the overlap of the redirected portion of the first light and the redirected portion of the second light indicates coplanarity of the first surface and the second surface and the redirected portion of the first light and the redirected portion of the second light define a second angle, that is greater than the first angle, with respect to each other.

12. The method of claim 11, wherein:
the first surface includes one or more diffraction structures for redirecting the at least a portion of the first light; and
the second surface includes one or more diffraction structures for redirecting the at least a portion of the second light.

13. The device of claim 1, wherein the at least one light source includes a first light source positioned to provide the first light and a second light source positioned to provide the second light, and the first light source and the second light source include beam delivery optics that split light generated within the at least one light source into the first light and the second light.

14. The device of claim 4, wherein the first laser and the second laser are pumped by a common pump laser.

15. The device of claim 14, wherein the first light and the second light are coherent to each other.

16. The device of claim 1, wherein the at least one light source includes a first light source positioned to provide the first light and a second light source positioned to provide the second light, and the second light source is positioned on an opposite side of the first surface from the first light source.

17. A device for determining coplanarity of two surfaces, the device comprising:
a first light source positioned to provide first light that is non-perpendicular to a first surface, wherein the first surface redirects at least a portion of the first light via diffraction;
a second light source positioned to provide second light that is non-perpendicular to a second surface, wherein the second surface is distinct and separate from the first surface, the second surface redirects at least a portion of the second light via reflection or refraction, the first light provided by the first light source and the second light provided by the second light source are non-parallel to each other, and the portion of the first light redirected by the first surface and the portion of the second light redirected by the second surface are substantially parallel to each other; and
an optical detector positioned to receive an overlap of the redirected portion of the first light and the redirected portion of the second light, wherein an image of the overlap of the redirected portion of the first light and the redirected portion of the second light indicates coplanarity of the first surface and the second surface.

* * * * *